(12) United States Patent
Kim et al.

(10) Patent No.: US 9,618,983 B2
(45) Date of Patent: Apr. 11, 2017

(54) SELECTIVELY RECESSED REFERENCE PLANE STRUCTURE IN MODULE TAB AREA OF MEMORY MODULE AND METHOD FOR FORMING SELECTIVELY RECESSED REFERENCE PLANE

(71) Applicant: SAMSUNG ELECTRONICS CO., LTD., Suwon-si, Gyeonggi-do (KR)

(72) Inventors: Dongyeop Kim, Hwaseong-si (KR); Jaejun Lee, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 87 days.

(21) Appl. No.: 14/625,837

(22) Filed: Feb. 19, 2015

(65) Prior Publication Data
US 2015/0241930 A1 Aug. 27, 2015

(30) Foreign Application Priority Data
Feb. 25, 2014 (KR) .................. 10-2014-0022140

(51) Int. Cl.
*G06F 1/16* (2006.01)
*G06F 1/18* (2006.01)

(52) U.S. Cl.
CPC ............... *G06F 1/18* (2013.01); *G06F 1/189* (2013.01)

(58) Field of Classification Search
CPC .................. H05K 1/0271; H01L 23/49827
USPC ............... 257/686, 774, 421, 488; 174/541; 438/149, 30, 464, 479, 109; 429/220, 429/149, 127; 361/679.01, 679.55, 361/679.26, 679.03, 679.56, 79.43, 361/679.44, 679.41, 679.4, 679.57, 361/679.02
See application file for complete search history.

(56) References Cited

U.S. PATENT DOCUMENTS

| | | | |
|---|---|---|---|
| 5,229,639 A | 7/1993 | Hansen et al. | |
| 5,838,549 A | 11/1998 | Nagata et al. | |
| 6,320,247 B2 * | 11/2001 | Sakamoto | ............ 174/541 |
| 6,762,368 B2 | 7/2004 | Saputro et al. | |
| 6,914,278 B2 | 7/2005 | Forbes et al. | |
| 6,953,893 B1 * | 10/2005 | Kuzmenka | ...... H01L 23/3114 174/541 |
| 7,852,145 B2 | 12/2010 | Uematsu et al. | |
| 2006/0081972 A1 | 4/2006 | Katagiri et al. | |
| 2007/0149060 A1 | 6/2007 | Ye | |
| 2010/0213592 A1 * | 8/2010 | Ishii | ............ H01L 23/49827 257/686 |
| 2011/0291293 A1 * | 12/2011 | Tuominen | ...... H05K 1/0271 257/774 |

FOREIGN PATENT DOCUMENTS

| | | |
|---|---|---|
| JP | 09-205283 A | 8/1997 |
| JP | 10-294435 A | 11/1998 |

* cited by examiner

*Primary Examiner* — Hung Duong
(74) *Attorney, Agent, or Firm* — Lee & Morse P.C.

(57) ABSTRACT

A memory module includes a signal tab and a power tab spaced apart from each other on a surface layer of a substrate, the signal tab and the power tab defining a module tab area, a reference plane layer below the surface layer, the reference plane layer being recessed below the signal tab and being non-recessed below the power tab, and an insulating layer between the surface layer and the reference plane layer.

20 Claims, 11 Drawing Sheets

SELECTIVELY RECESSED REFERENCE PLANE STRUCTURE IN MODULE TAB AREA OF MEMORY MODULE AND METHOD FOR FORMING SELECTIVELY RECESSED REFERENCE PLANE

CROSS-REFERENCE TO RELATED APPLICATION

Korean Patent Application No. 10-2014-0022140, filed on Feb. 25, 2014, in the Korean Intellectual Property Office, and entitled: "Selectively Recessed Reference Plane Structure in Module Tab Area of Memory Module and Method for Forming Selectively Recessed Reference Plane," is incorporated by reference herein in its entirety.

BACKGROUND

1. Field

Embodiments relate to memory modules on which semiconductor memory modules are mounted. More particularly, embodiments relate to a selectively recessed reference plane structure in a module tab area of a memory module and a method for forming a selectively recessed reference plane.

2. Description of the Related Art

A dynamic random access memory (DRAM) or a magnetic random access memory (MRAM) may be used as a main memory of a memory system. For example, in order to increase capacity of a DRAM, a plurality of semiconductor memory chips may be mounted on a single substrate to constitute a memory module.

A memory module may be classified into a single in-line memory module (SIMM) and a dual in-line memory module (DIMM). A SIMM is an older memory module in which pins are formed on only one surface of a printed circuit board (PCB), while a DIMM is a module in which pins are formed on both surfaces of a PCB.

Memory chips may be mounted on one surface or both surfaces of a PCB in both a SIMM and a DIMM. However, due to structural characteristics, memory chips are generally mounted on one surface of a PCB in a SIMM and on both surfaces of a PCB in a DIMM.

SUMMARY

The present disclosure provides a selectively recessed reference plane structure in a module tab area of a memory module and a method for forming selectively recessed reference plane.

Embodiments of the disclosure provide a memory module. In some embodiments, the memory module may include a signal tab and a power tab spaced apart from each other on a surface layer of a substrate, the signal tab and the power tab defining a module tab area, a reference plane layer below the surface layer, the reference plane layer being recessed below the signal tab and being non-recessed below the power tab, and an insulating layer between the surface layer and the reference plane layer.

In an exemplary embodiment, the power tab may be a tab applied with a power supply voltage.

In an exemplary embodiment, the power tab may be a tab applied with a ground voltage.

In an exemplary embodiment, the surface layer and the reference plane layer may be made of the same conductive metal.

In an exemplary embodiment, the conductive metal may be a copper or a copper-based alloy.

In an exemplary embodiment, the insulating layer may be a prepreg layer.

In an exemplary embodiment, when a PCB substrate of the memory module has a multi-layer structure, the surface layer may include a first surface layer disposed at an uppermost portion and a second surface layer disposed at a lowermost portion and the reference plane layer may include a first reference plane layer disposed below the first surface layer and a second reference plane layer above the second surface layer.

In an exemplary embodiment, the module tab area may be an area in which the signal tab and the power tab are disposed.

In an exemplary embodiment, the memory module may be a dual in-line memory module (DIMM).

In an exemplary embodiment, as the reference plane layer is non-recessed below the power tab, inductance of the power tab may be reduced compared with a case where the reference plane layer is recessed.

In an exemplary embodiment, the reference plane layer may be recessed only below the signal tab.

Embodiments of the disclosure provide a method for forming a selectively recessed reference plane. In some embodiments, the method may include forming a reference plane layer in a module tab area to be recessed below signal tabs and to be non-recessed below power tabs when fabricating a memory module including the signal tabs and the power tabs disposed to be spaced apart from each other on a surface layer of a substrate and the reference plane layer disposed below the surface layer with an insulating layer interposed therebetween.

In an exemplary embodiment, signal tabs may be contact terminals for data communication between a semiconductor memory chip and an external controller.

In an exemplary embodiment, the power tabs may be contact terminals to apply a power supply voltage or a ground voltage to a semiconductor memory chip.

In an exemplary embodiment, the signal tabs may be recessed by means of an etch process.

In an exemplary embodiment, a material of the signal tabs and the power tabs may be identical to that of the reference plane layer.

Embodiments of the disclosure provide a memory module. The memory module may include a signal tab and a power tab spaced apart horizontally from each other on a surface layer of a substrate, a reference plane layer on the surface layer, the reference plane layer including a layer portion overlapping the power tab, and an empty space overlapping the signal tab, and an insulating layer between the surface layer and the reference plane layer.

In an exemplary embodiment, the empty space may overlap only the signal tab.

In an exemplary embodiment, the reference plane layer may be electrically connected to the power tab through a via contact in the insulating layer.

In an exemplary embodiment, the substrate may be a multi-layered printed circuit board (PCB).

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
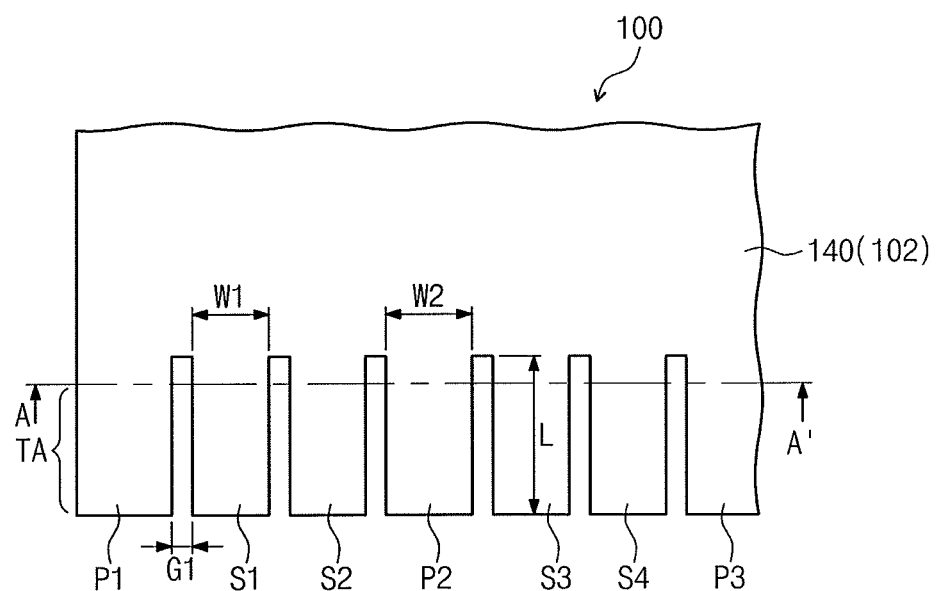
FIG. 1 illustrates a shape diagram of a memory module according to embodiments.

Example embodiments of the present disclosure will now be described more fully through the following exemplary embodiments related to the accompanying drawings. However, the disclosure is not limited to the following embodiments but may be embodied in other forms.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," "on" versus "directly on," etc.).

Moreover, the same or like reference numerals in each of the drawings represent the same or like components if possible. In some drawings, the connection of elements and lines is just represented to effectively explain technical content and may further include other elements or circuit blocks.

Note that each embodiment that is herein explained and exemplified may also include its complementary embodiment, and the details of basic data access operations to a DRAM or a memory module and internal function circuits and the details of a module structure and a structure or shape of a module tab area may not be described in order not to make the subject matter of the disclosure ambiguous.

FIG. 1 is a shape diagram showing a top view of a memory module 100 according to embodiments.

Figure 6:
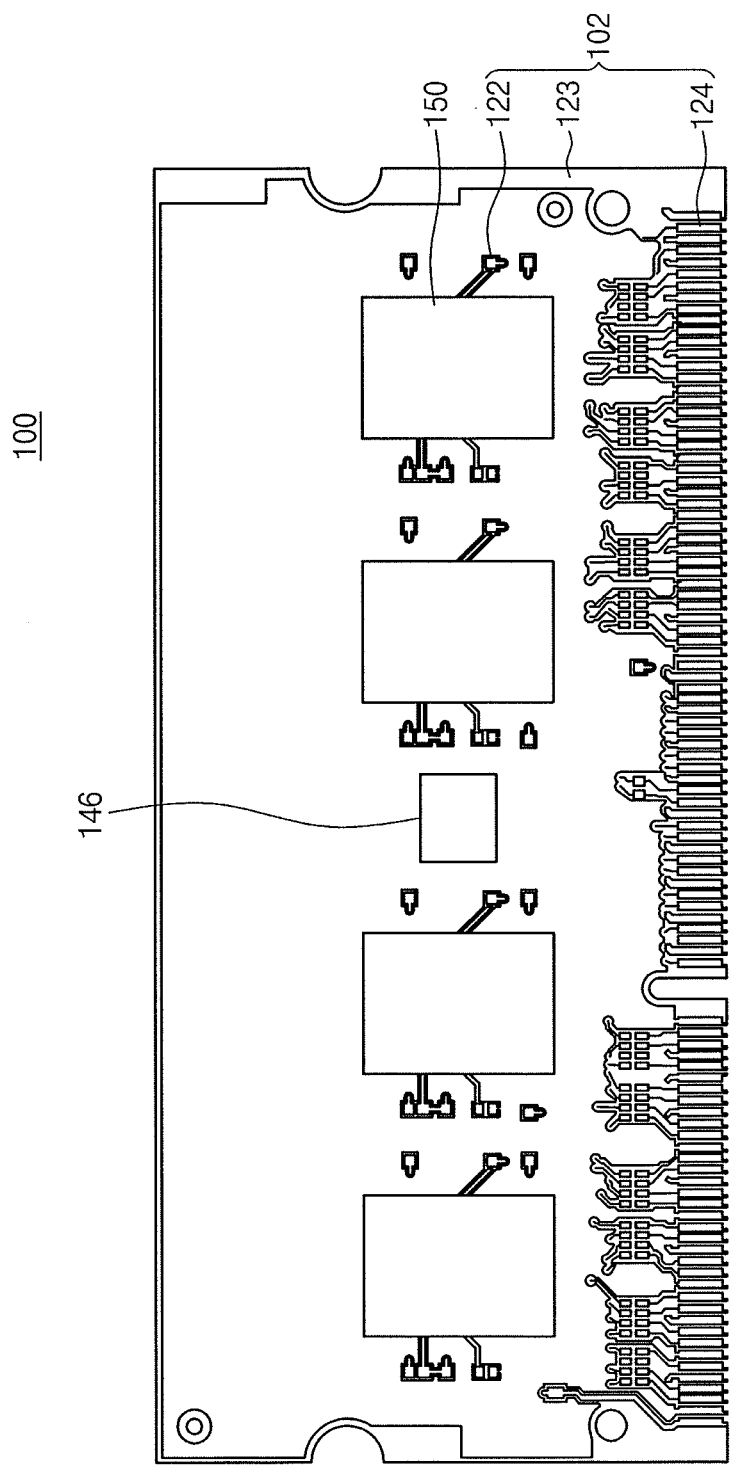
FIG. 6 illustrates a shape diagram of the overall appearance of a memory module according to an embodiment of FIG. 1.

Referring to FIG. 1, the memory module 100 may include a substrate 102 implemented using a printed circuit board (PCB). A memory chip 150 may be mounted on the substrate 102, as shown in FIG. 6.

As illustrated in FIG. 1, a plurality of power tabs P1, P2 and P3, and a plurality of signal tabs S1, S2, S3, and S4 may be disposed in a module tab area TA of the memory module 100. In the module tab area TA, a plurality of tabs may each have a set length L and set widths W1 and W. For example, the power tab P2 may have length L and width W2, and the signal tab S2 may have length L and width W1. Although the widths W1 and W2 are different from each other in the figure, they may be equal to each other. In the module tab area TA, a plurality of tabs may be spaced apart from each other at an interval G1 to be electrically insulated from each other.

A layer where the plurality of tabs are disposed may be a surface layer that is an uppermost layer of the substrate 102, and may substantially be made of copper on the substrate 102. For example, a surface layer 140 of the substrate 102 may be an uppermost layer of the substrate 102, and may include the plurality of power tabs P1, P2 and P3, and the plurality of signal tabs S1, S2, S3, and S4, as will be described in more detail below with reference to FIG. 3. The substrate 102 may further include a plurality of inner layers, as will described in more detail below with reference to FIG. 2.

Figure 2:
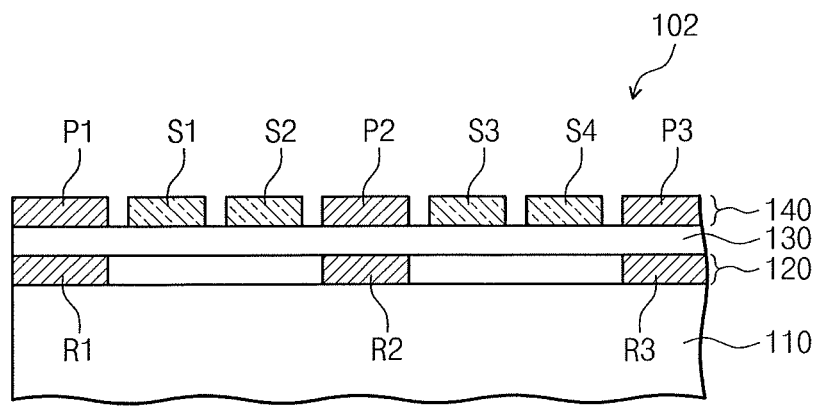
FIG. 2 illustrates a cross-sectional view taken along line A-A' in FIG. 1.

FIG. 2 is a cross-sectional view taken along the line A-A' in FIG. 1.

Figure 3:
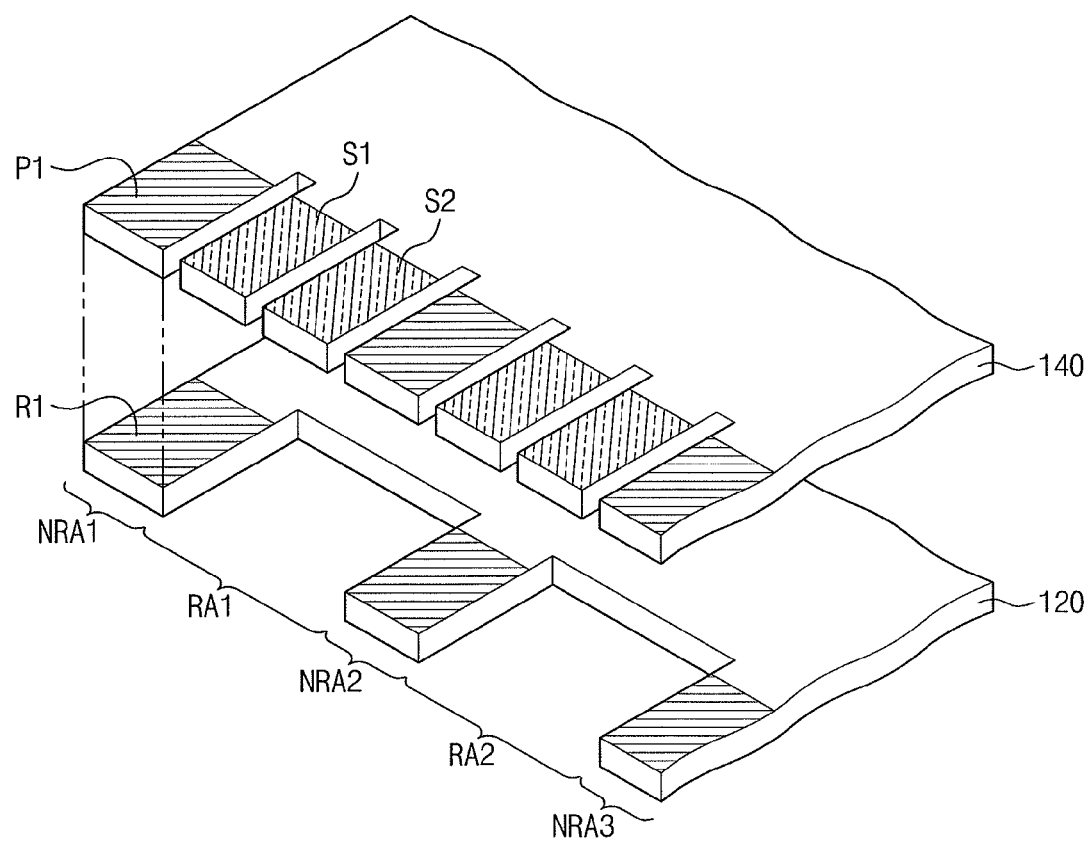
FIG. 3 illustrates a schematic shape diagram of a surface layer and a reference plane layer in FIG. 2.

Referring to FIG. 2, among the inner layers of the substrate 102, a reference plane layer 120 is formed. The reference plane layer 120 is disposed on the surface layer 140 with an insulating layer 130 interposed therebetween. The reference plane layer 120 may function as a signal line to provide a reference to signals transmitted through the signal tabs S1, S2, S3, and S4. The reference plane layer 120 may be electrically connected to the power tabs P1, P2, and P3 through a via contact. In the module tab area TA, the shape of the reference plane layer 120 may be as shown in FIGS. 2-3.

In detail, referring to FIG. 2, in the module tab area TA, the reference plane layer 120 is recessed below the signal tab S1 and non-recessed below the power tab P1. For example, as illustrated in FIG. 2, the reference plane layer 120 is recessed to have empty spaces below the signal tabs S1 through S4, while it includes portions R1 through R3 that extend to overlap the respective power tabs P1 through P3. The reference plane layer 120 is disposed on a substrate body layer 110, e.g., the reference plane layer 120 may be between the substrate body layer 110 and the insulating layer 130.

As illustrated in FIG. 2, a first cross-sectional shape portion R1 of the reference plane layer 120 is non-recessed below the power tab P1, a second cross-sectional shape layer R2 is non-recessed below the power tab P2, and a third cross-sectional shape portion R3 is non-recessed below the power tab P3. Since the reference plane layer 120 is recessed below the signal tabs S1, S2, S3, and S4, i.e., since the reference plane layer 120 includes empty spaces below the signal tabs S1 through S4, a cross-sectional shape layer, such as the cross-sectional shape portions R1 through R3, is not formed below the signal tabs S1, S2, S3, and S4. This will be discussed in more detail below with reference to FIG. 3.

If a portion of the reference plane layer 120 is recessed below the signal tabs S1, S2, S3, and S4, parasitic capacitance of a signal tab is reduced to improve single integrity (SI). Further, if a portion of the reference plane layer 120 is non-recessed below the power tabs P1, P2, and P3, inductance of a power tab is prevented from increasing to improve power integrity (PI). Thus, according to embodiments, not all portions of the reference plane layer 120 are recessed in the module tab area TA, i.e., only portions of the reference plane layer 120 disposed below signal tabs are recessed.

Therefore, if a memory module includes a reference plane layer below a surface layer of a substrate with a signal tab, a power tab, and an insulating layer spaced apart from each other and interposed between the reference plane layer and the surface layer, the reference plane layer is recessed below the signal tab and non-recessed below the power tab in a module tab area. Thus, speed of signal transmission through the signal tabs is improved and increase of inductance of the power tabs is minimized or prevented to improve power integrity PI.

FIG. 3 is a schematic shape diagram of the surface layer 140 and the reference plane layer 120 in FIG. 2. It is noted that the insulating layer 130 between the surface layer 140 and the reference plane layer 120 is omitted from FIG. 3 for clarity and convenience.

Referring to FIG. 3, the surface layer 140 is disposed on the reference plane layer 120 with the insulating layer 130 interposed therebetween. For example, the insulating layer 130 may be a prepreg layer disposed below the surface layer 140.

The surface layer 140 may be made of, e.g., a copper coil. However, a material of the surface layer 140 is not limited to the copper coil. For example, the surface layer 140 may be made of other metals, e.g., aluminum (Al) and/or nickel (Ni), than copper (Cu). For example, the surface layer 140 may be made of not a single layer but a multi-layer metal interconnection, e.g., Ni/Cu, Al/Ni, and TiW/Ni. The surface layer 140 may be selectively etched to form a set module tab pattern.

Referring to FIG. 3, an edge region of the reference plane layer 120 is shown. That is, as illustrated in FIG. 3, a portion of the edge region of the reference plane layer 120 is divided into non-recessed regions NRA1, NRA2 and NRA3, and recessed regions RA1 and RA2 in the module tab area TA. The power tabs P1, P2, and P3 are disposed in upper corresponding areas of the non-recessed regions NRA1, NRA2, and NRA3, e.g., each of the power tabs P1 through P3 in the surface layer 140 extends above and overlaps a corresponding non-recessed regions NRA1 through NRA3 of the reference plane layer 120. Further, the signal tabs S1, S2, S3, and S4 are disposed in upper corresponding areas of the recessed regions RA1 and RA2, e.g., the signal tabs S1 and S2 in the surface layer 140 extend above and overlap the non-recessed region NRA1 of the reference plane layer 120.

The reference plane layer 120 may be a power layer supplied with a power supply voltage or a ground voltage. This will be discussed in more detail below with reference to FIG. 4.

Figure 4:
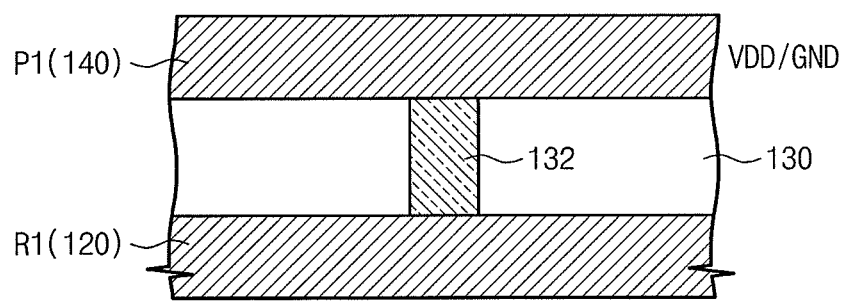
FIG. 4 illustrates a cross-sectional view of an electrical connection of a power tab and a reference plane layer in FIG. 2.

FIG. 4 is a cross-sectional view showing an electrical connection of the power tab P1 and the reference plane layer 120. For example, referring to FIG. 4, the power tab P1 in the surface layer 140 and the first cross-sectional shape portion R1 of the reference plane layer 120 may be electrically connected to each other through a via contact 132 formed through the insulating layer 130, e.g., the insulating layer 130 may be a prepreg layer.

Figure 5:
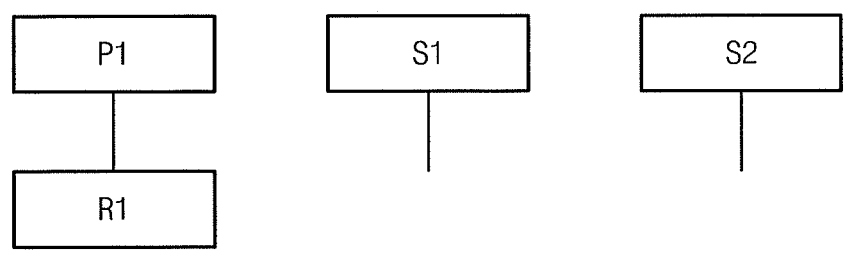
FIG. 5 illustrates power integrity improvement and signal integrity improvement.

FIG. 5 illustrates a schematic diagram of power integrity improvement and signal integrity improvement. Referring to FIG. 5, the power tab P1 depends on the influence of an underlying non-recessed reference plane area R1, such that increase of inductance of the power tab P1 is minimized or prevented to improve power integrity PI. Further, as the edge region of the reference plane layer 120 is recessed below the signal tabs S1 and S2, capacitance of the signal tabs S1 and S2 is reduced to make high-speed operating characteristics powerful.

FIG. 6 is a detailed shape diagram of the memory module 100 in FIG. 1. As illustrated in FIG. 6, and as discussed previously, the memory module 100 may include the substrate 102, which may be a printed circuit board (PCB), and a plurality of the memory chips 150 may be mounted thereon.

The substrate 102 may be formed by coating a copper foil on a board of a phenol or epoxy glass (or FR-4) resin pressed to a constant thickness. The copper foil may be patterned in the substrate 102 to form a circuit interconnection. An electronic component, e.g., the memory chip 150, may be connected to the circuit interconnection through a bump or the like to be mounted.

The substrate 102 may be classified into a single-layer PCB substrate with an interconnection formed on only one surface and a double-layer PCB substrate with an interconnection formed on both surfaces. The number of copper-foil layers may be three or more using a prepreg that is an insulator, and three or more interconnection layers may be formed on the substrate 102 according to the number of the copper-foil layers.

The memory chips 150 may be mounted on at least one surface of the substrate 102 in a flip-chip manner. The module tab area TA of the substrate 102 may include the same elements as shown in FIGS. 2-3 to provide a reliable memory module, e.g., dual in-line memory module (DIMM) with improved power integrity.

The chip 150 mounted on the substrate 102 may be a memory chip or a logic chip. When the chip is a memory chip 150, the memory chip 150 may include at least one of a DRAM, a static random access memory (SRAM), a flash memory, an electrically erasable programmable read only memory (EEPROM), a phase change random access memory (PRAM), a magnetoresistive random access memory (MRAM), and a resistive random access memory (RRAM). In some embodiments, the memory chip 150 may be a double data rate (DDR)-type DRAM.

As explained above, the memory chip 150 may be mounted on any one surface or both surfaces of the substrate 102. Although FIG. 6 illustrates four memory chips that are mounted on the substrate 102, a number of the mounted memory chips 150 is not limited to four. For example, eight or sixteen memory chips 150 may be mounted on the substrate 102. Further, although the memory chip 150 is simply quadrangular in the FIG. 6, the memory chip 150 may be substantially mounted on the substrate 102 not in a bare-chip type but in a package type.

Referring back to FIG. 6, a buffer chip 146 relays data transmission between the memory chip 150 and a memory controller disposed outside the memory module 100. For example, the buffer chip 146 may be an advanced memory buffer (AMB). The AMB is connected to all DRAMs mounted on the memory module 100 to store data transmitted from the memory controller in a DRAM. The AMB reads requested data from a DRAM and transmits the data to the memory controller. In special cases, the AMB may transmit data to an AMB of a memory module mounted in the next slot or transmit a request of the memory controller.

The memory module 100 may include the buffer chip 146 to achieve high transmission bandwidth and high capacity. However, while in this embodiment the memory module 100 includes the buffer chip 146, the memory module 100 may not include the buffer chip 146 in other embodiments.

In FIG. 6, a plurality of tabs 124 correspond to the plurality of power tabs P1, P2 and P3, and to the plurality of signal tabs S1, S2, S3, and S4 disposed in the module tab area TA in FIG. 1. The tabs 124 refer to terminal pins of the substrate 102. When these terminal pins are formed on only one surface of a PCB substrate, a memory module is referred to as an SIMM. When these terminal pins are formed on both surfaces of a PCB substrate, a memory module is referred to as a DIMM.

The memory module 100 is inserted into a socket of a main board in a laptop computer, a smartphone or the like, and an electric contact between the substrate 102 and a main board are made through the tabs 124. In this embodiment, the memory module 100 may be a DIMM, e.g., a small outline DIMM (SODIMM) applied to mobile devices such as a smartphone, a laptop computer, a net book, a smart pad, and the like. Since the tab area of the memory module 100 in FIG. 6 has the cross-sectional structure shown in FIG. 2, increase of inductance of power tabs is minimized or prevented to improve power integrity, and capacitance of signal tabs is reduced to make high-speed operating characteristics of the memory module powerful.

Figure 7:
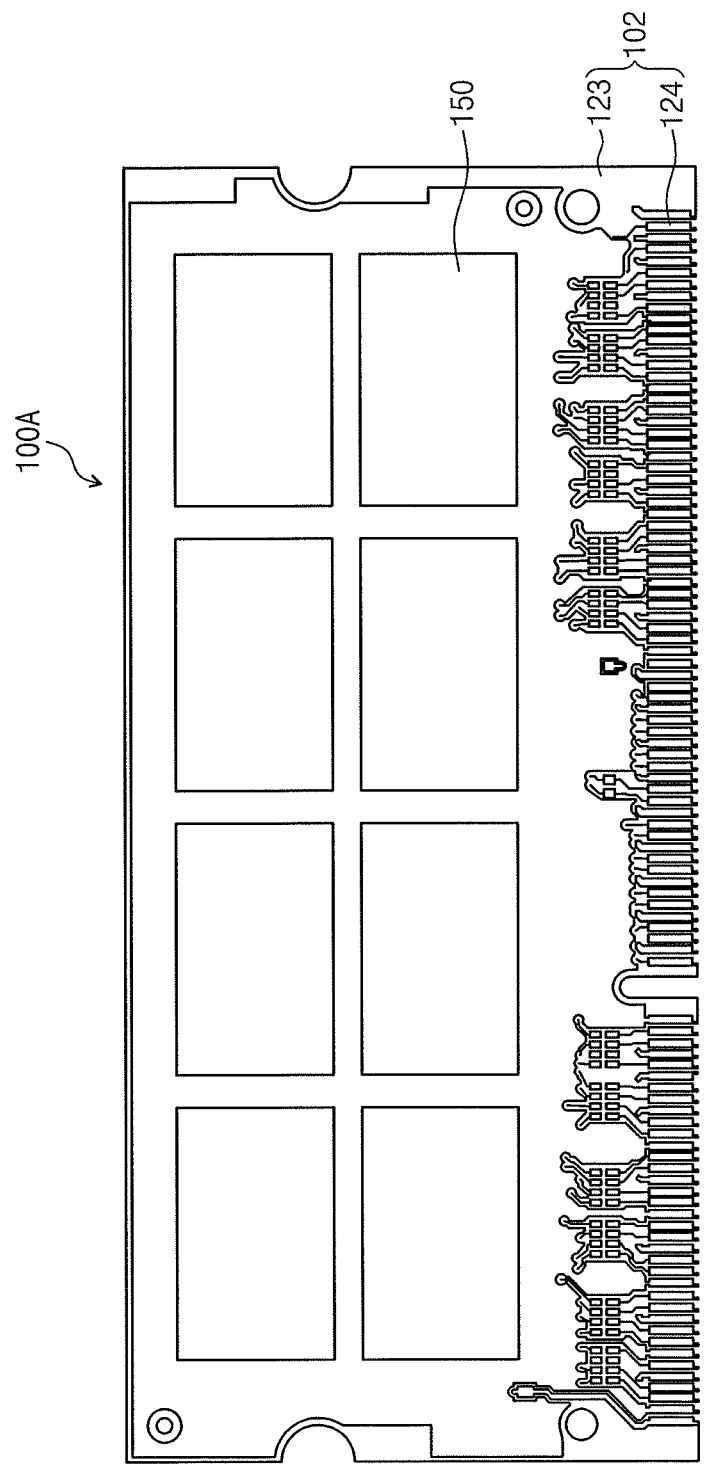
FIG. 7 illustrates a shape diagram of the overall appearance of a memory module according to another embodiment of FIG. 1.

FIG. 7 is a shape diagram showing the overall appearance of a memory module according to another embodiment of FIG. 1.

Referring to FIG. 7, a memory module 100A is similar to the memory module 100 in FIG. 6 but is different in the number of memory chips mounted on the substrate 102. That is, four memory chips are mounted in the memory module 100 in FIG. 6, while eight memory chips 150 may be mounted in the memory module 100A in FIG. 7.

Further, the buffer chip 146 is disposed on the substrate 102 in the memory module 100 in FIG. 6, while a buffer chip is not disposed in FIG. 7. However, it will be understood that a buffer chip may be additionally disposed in the memory module 100A in FIG. 7.

The module 100A in FIG. 7 may be a DIMM, e.g., a SODIMM. Thus, a plurality of tabs being terminal pins may be formed on both surfaces of a PCB substrate. Since a tab area of the memory module 100A in FIG. 7 also has a cross-sectional structure shown in FIG. 2, increase of inductance of power tabs is minimized or prevented to improve power integrity. Moreover, capacitance of signal tabs is reduced due to a recessed region to improve high-speed operating characteristics of the memory module 100A.

Figure 8:
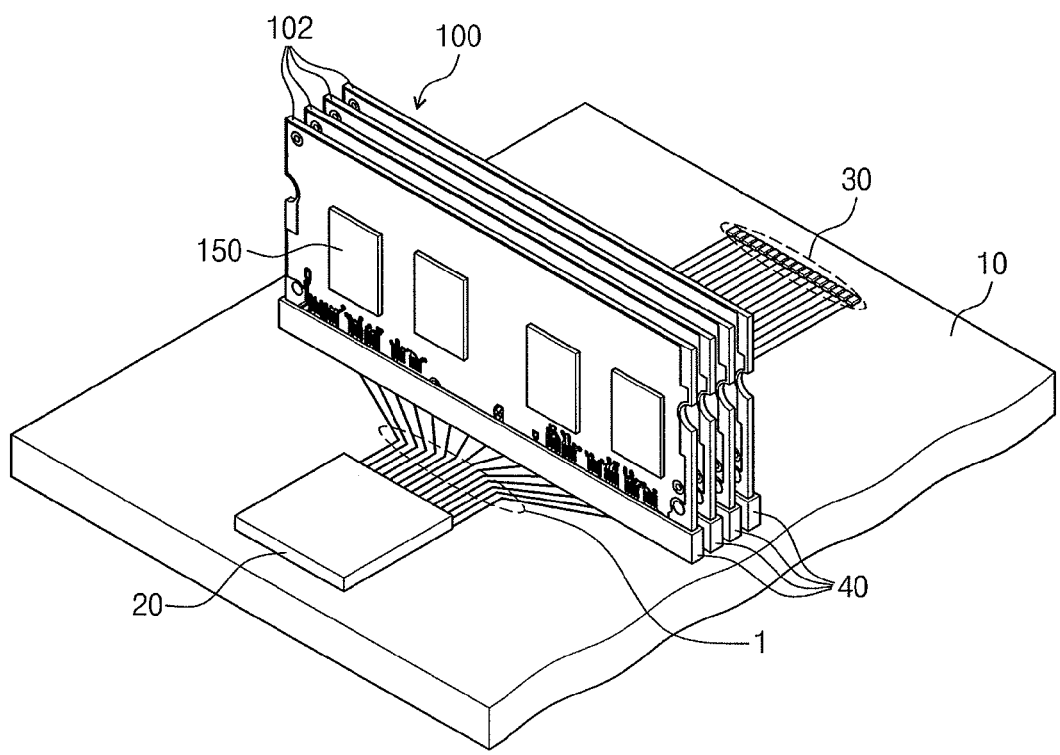
FIG. 8 illustrates an exemplary shape diagram of the memory module in FIG. 6 or FIG. 7 mounted on a main board.

FIG. 8 is an exemplary shape diagram showing the memory module 100 (or 100A) mounted on a main board 10.

Referring to FIG. 8, a memory controller 20 and a plurality of connection sockets 40 mounted on the main board 10 may be electrically connected to each other through a bus 1. A required number of memory modules 100/100A, each having a layout structure shown in FIG. 6 or 7, may be inserted into the connection socket 40. Since in FIG. 8, four substrates 102 are inserted into four connection sockets 40, respectively, four memory modules are electrically connected to the memory controller 20. A reference numeral 30 may represent termination resistances for impedance matching.

According to a structure where a plurality of memory modules 100A are inserted into corresponding connection sockets 40, respectively, as shown in FIG. 8, the memory controller 20 may store data in the memory chip 150 mounted on a memory module or may read data stored in the memory chip 150. During such a data read or data write operation, power integrity and signal integrity are improved due to a tab area structure of a memory module according to the embodiments.

In FIG. 8, the memory chip 150 may be a DRAM but may be implemented using a nonvolatile memory chip. The nonvolatile memory chip may be, e.g., an electrically erasable programmable read only memory (EEPROM), a flash memory, a magnetic random access memory (MRAM), a spin-transfer torque MRAM, a conductive bridging RAM (CBRAM), a ferroelectric RAM (FeRAM), a phase change RAM (PRAM) which is also called an ovonic unified memory (OUM), a resistive RAM (RRAM or ReRAM), a nanotube RRAM, a polymer RAM (PoRAM), a nano floating gate memory (NFGM), a holographic memory, a molecular electronics memory device or an insulator resistance change memory.

Figure 9:
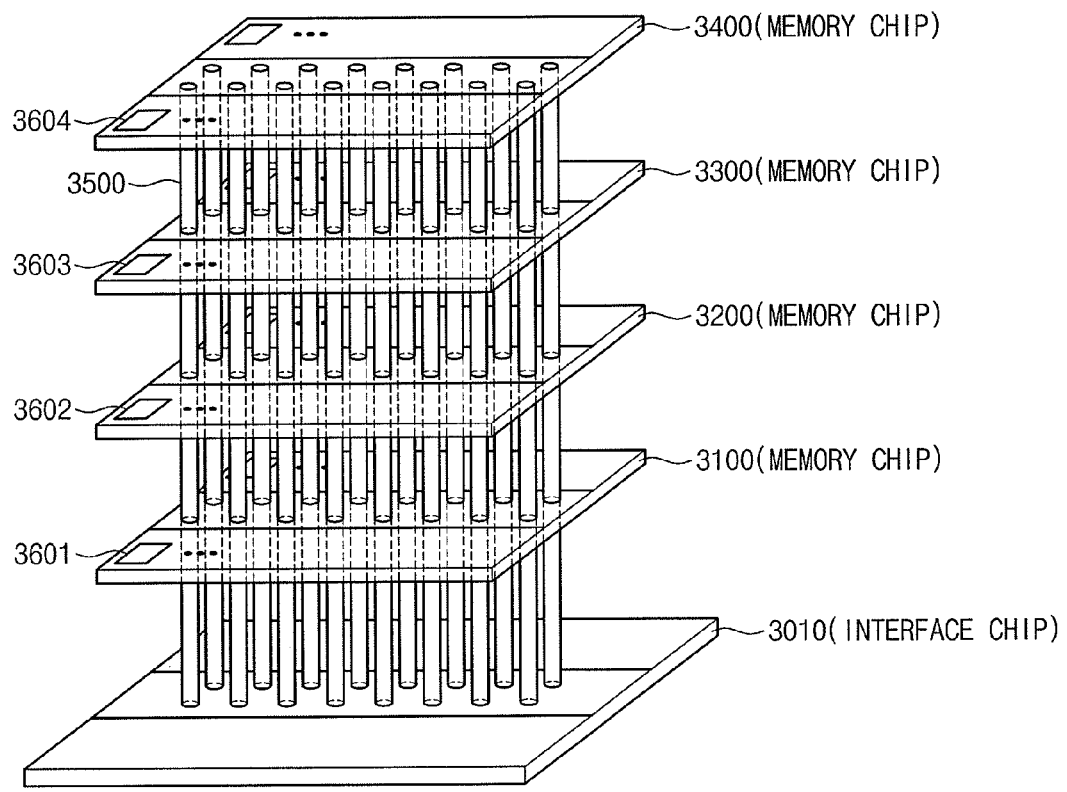
FIG. 9 illustrates an application example of a memory module according to embodiments in a memory system stacked through a through-silicon via (TSV)

FIG. 9 illustrates an example of embodiments applied to a memory system stacked through a through silicon via (TSV). Referring to FIG. 9, an interface chip 3010 is disposed at a lowermost layer and memory chips 3100, 3200, 3300, and 3400 are disposed thereon. The memory chips 3100, 3200, 3300, and 3400 may include sensing and storage circuits 3601, 3602, 3603, and 3604, respectively. Chips may be connected through a micro bump (μBump) 3500. The respective chips may be connected through a TSV. For example, one or more chips may be stacked. In the case of FIG. 9, the memory chips 3100, 3200, 3300, and 3400 may constitute a single memory module, as shown in FIG. 6 or 7.

Figure 10:
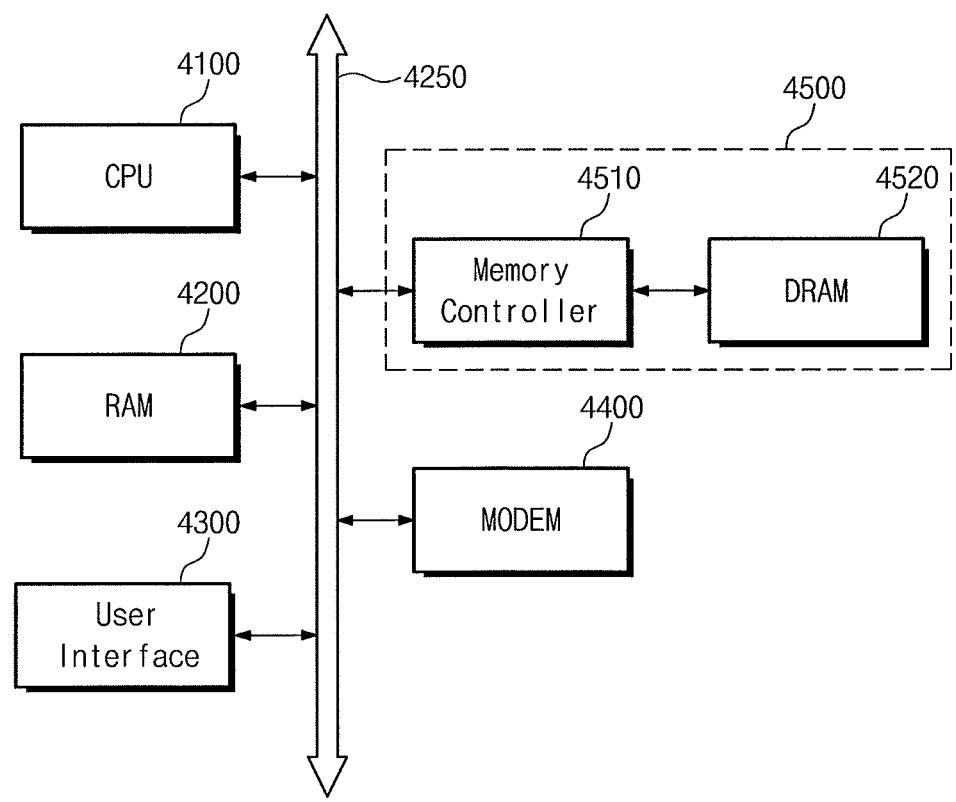
FIG. 10 illustrates a block diagram of an example of a memory module according to embodiments applied to a computing device.

FIG. 10 is a block diagram illustrating an example of embodiments applied to a computing device. As illustrated, the computing device may include a memory system 4500 including a DRAM 4520 and a memory controller 4510. A plurality of DRAMs 4520 may be stacked on a substrate to constitute a memory module according to embodiments.

The computing device may include an information processing device, a computer or the like. In some embodiments, the computing device may include a memory system 4500 and a modem 4400, a CPU 4200, a RAM 4200, and a user interface 4300 that are electrically connected to a system bus 4250. Data processed by the CPU 4100 or externally input data may be stored in the memory system 4500.

The computing device may be applied to a solid state disk (SSD), a camera image sensor, and other application chipsets. In some embodiments, the memory system 4500 may be configured with a SSD. In this case, the computing device may stably and reliably store large-capacity data in the memory system 4500.

Since the DRAM 4520 constituting the memory system 4500 may constitute a memory module shown in FIG. 6, power integrity may be improved.

The memory controller 4510 may apply a command, an address, data or other control signals to the DRAM 4520 channel-independently.

The CPU 4100 functions as a host and controls the overall operation of the computing device.

A host interface between the CPU 4100 and the memory controller 4150 may include various protocols for data exchange between a host and the memory controller 4500. In exemplary embodiments, memory controller 4510 may be configured to communicate with a host or an external device through one of various interface protocols such as USB (Universal Serial Bus) protocol, MMC (Multimedia Card) protocol, PCI (Peripheral Component Interconnection) protocol, PCI-E (PCI-Express) protocol, ATA (Advanced Technology Attachment) protocol, SATA (Serial ATA) protocol, ESDI (Enhanced Small Disk Interface) protocol, and IDE (Integrated Drive Electronics) protocol.

The computing device shown in FIG. 10 may be applied as one of a computer, an Ultra Mobile PC (UMPC), a digital picture player, a digital video recorder, a digital video player, a storage constituting a data center, a device capable of transmitting/receiving data in an wireless environment and various electronic devices constituting a home network, one of various electronic devices constituting a computer network, one of various electronic devices constituting a telematics network, a radio-frequency identification (RFID) device, or one of various constituents constituting a computing system.

The DRAM chip 4520 or a chip of the CPU 4100 may be packaged as one of various types to be subsequently embedded. For example, a chip may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Figure 11:
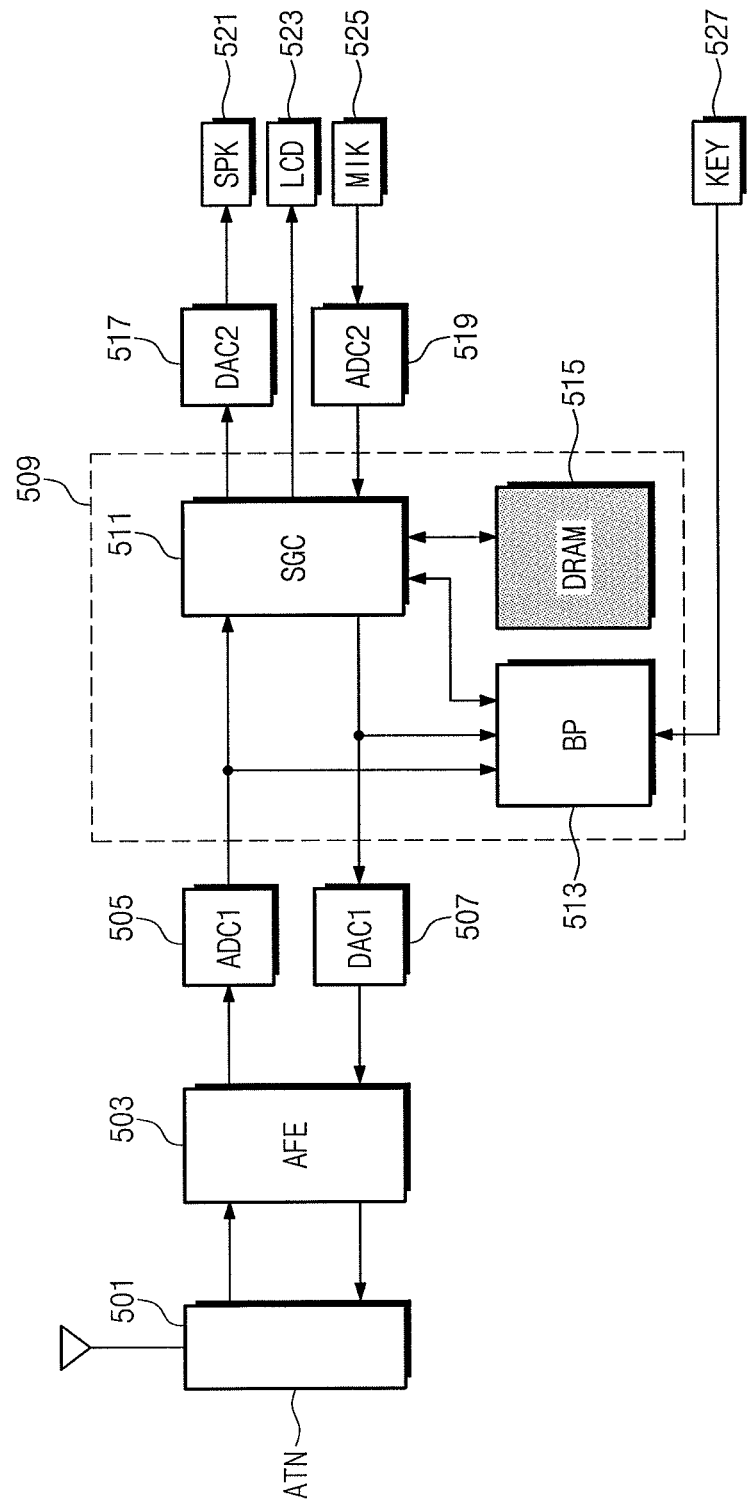
FIG. 11 illustrates a block diagram of an example of a memory module according to embodiments applied to a smartphone.

FIG. 11 is a block diagram illustrating an example of embodiments applied to a smartphone. Specifically, FIG. 11 shows a principal part block diagram of a mobile phone such as a smartphone in which a DRAM is incorporated. The smartphone may include an antenna (ATN) 501, an analog front-end block (AFE) 503, analog-digital converter circuits (ADC1 and ADC2) 505, digital-analog converter circuits (DAC1 and DAC2) 507, a baseband block (BBD) 509, a speaker 521, a liquid crystal display (LCD) 523, a microphone (MIK) 525, and an input key (KEY) 521. Although not shown in this figure, the AFE 503 may be a circuit block that includes an antenna switch, a bandpass filter, various amplifiers, a power amplifier, a phase-locked loop (PLL), a voltage control oscillator (VCO), a quadrature demodulator, and a quadrature modulator to execution transmission and reception of radio waves. The BBD 509 may include a signal processing circuit (SGC) 511, a baseband processor (BP), and a DRAM 515.

The operation of the smartphone shown in FIG. 11 will now be explained. When a video including audio and text information is received, a radio wave received from an antenna is input to the ADC1 505 through the AFE 503 and is waveform-equalized and analog-to-digital converted. An output signal of the ADC1 505 is input to the SGC 511 in the BBD 509 to perform audio and video processing, and an audio signal is transmitted to the speaker 521 from the DAC2 517 and a video signal is transmitted to the LCD 523 from the speaker 521.

When the audio signal is transmitted, a signal received from the microphone 525 is input to the SGC 511 to perform audio processing. An output of the SGC 511 is transmitted to the antenna 501 from the DAC1 507 through AFE 503. When text information is transmitted, a signal received from the input key 527 is transmitted to the antenna 501 through the BBD 509, the analog-digital converter circuit 507, and the AFE 503.

In FIG. 11, the DRAM 515 may constitute a memory module shown in FIG. 1. In such a case, the DRAM 515 may be accessed by the BP 513 or an application processor (not shown). Although the DRAM 515 mounted is shown in FIG. 11, an MRAM may be mounted instead of the DRAM 515 in other embodiments. Volatile memory devices such as SRAM and DRAM lose their stored data when their power supplies are interrupted.

Meanwhile, nonvolatile memory devices such as MRAM retain their stored data even when their power supplies are interrupted. Accordingly, nonvolatile memory devices are preferentially used to store data when data does not want to be lost by power failure or power-off.

When a spin transfer torque magneto resistive random access memory (STT-MRAM) constitutes a memory module, advantages of an MRAM may be added to the advantages explained in FIG. 7.

An STT-MRAM cell may include a magnetic tunnel junction (MTJ) element and a selection transistor. The MTJ element may basically include a pinned layer, a free layer, and a tunnel layer disposed therebetween. A magnetization direction of the free layer is fixed and may be identical or opposite to that of the pinned layer.

Figure 12:
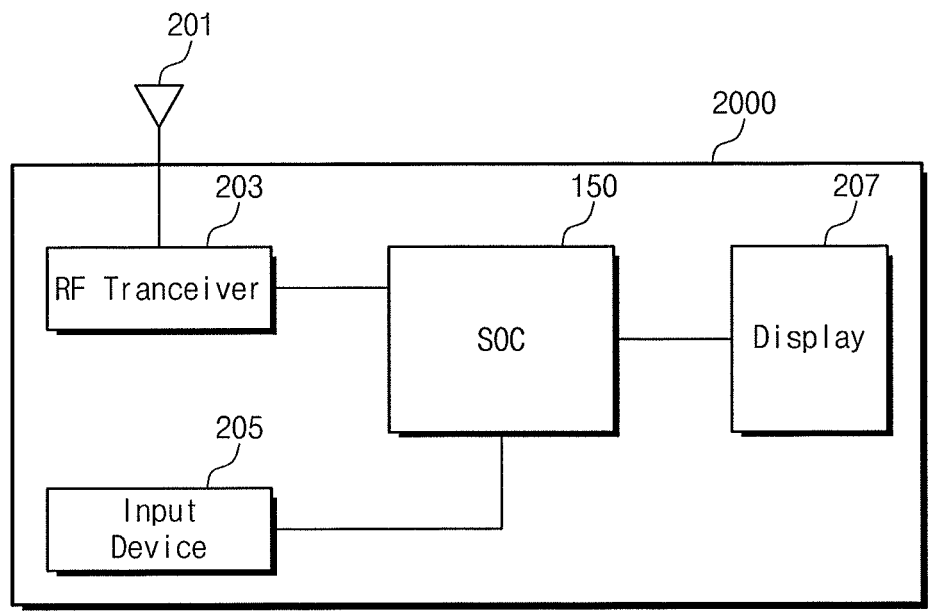
FIG. 12 illustrates a block diagram of an example of a memory module according to embodiments applied to a data processing system including a system-on-chip (SoC)

FIG. 12 is a block diagram illustrating an example of embodiments applied to a data processing system 2000 including an SoC. As illustrated, the data processing system 2000 may include an SoC 150, an antenna 201, an RF transceiver 203, an input device 205, and a display 207.

The RF transceiver 203 may transmit or receive an RF signal through the antenna 201. For example, the RF transceiver 203 may convert an RF signal received through the antenna 201 into a signal that may be processed in the SoC 150.

Thus, the SoC 150 may process a signal output from the RF transceiver 203 and transmit the processed signal to the display 207. In addition, the RF transceiver 203 may convert a signal output from the SoC 150 into an RF signal and output the converted RF signal to an external device through the antenna 201.

The input device 205 may input a control signal to control the operation of the SoC 150 or may input data to be processed by the SoC 150. The input device 205 may be implemented using a pointing device such as a touch pad and a computer mouse, a keypad or a keyboard.

Since the data processing system 2000 in FIG. 12 may include the SoC 150 in which a memory module in FIG. 6 or 7 is incorporated, power integrity may be improved.

Figure 13:
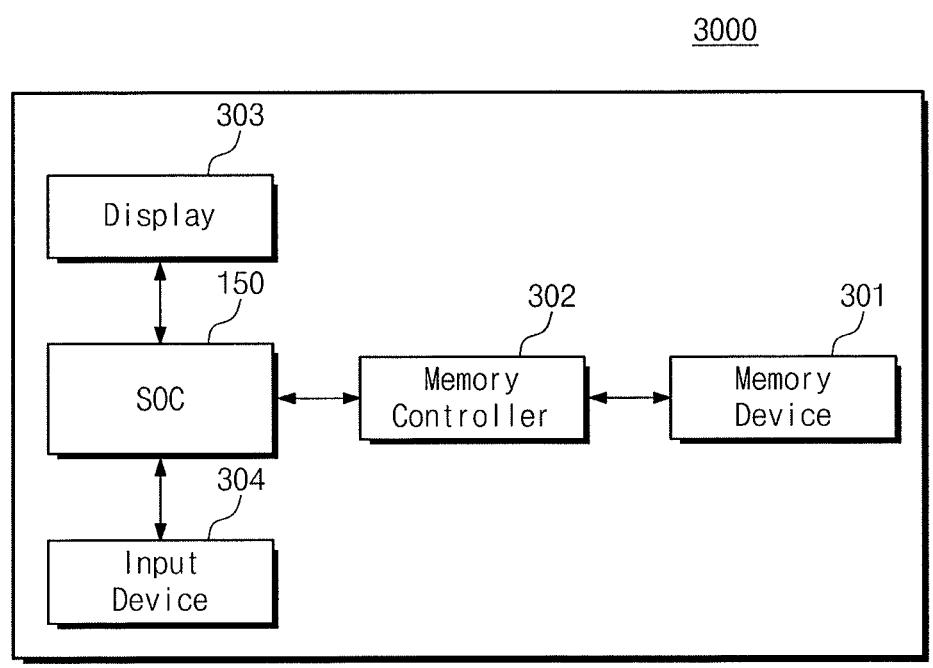
FIG. 13 illustrates a block diagram of an example of a memory module according to embodiments applied to another data processing system.

FIG. 13 is a block diagram illustrating an example of embodiments applied to another data processing system 3000. The data processing system 3000 may be implemented using a personal computer (PC), a network server, a tablet PC, a net-book, an e-reader, a personal digital assistant (PDA), a portable multimedia player (PMP), an MP3 player or a MP4 player.

As illustrated, the data processing system 3000 includes an SoC 150, a memory device 301, a memory controller 302 to control a data processing operation of the memory device 301, a display 303, and an input device 304. The memory device 301 may constitute a memory module.

The SoC 150 receives input data through the input device 304. Data stored in the memory device 301 may be displayed through the display 303 according to control and processing operations of the SoC 150. For example, the input device 304 may be implemented using a pointing device such as a touch pad and a computer mouse, a keypad or a keyboard. The SoC 150 may control the overall operation of the data processing system 3000 and control the operation of the memory controller 302.

The memory controller 302 to control the operation of the memory device 301 may be implemented as a part of the SoC 150 or may be implemented separately from the SoC 150.

Since the data processing system 3000 in FIG. 13 may include a memory system in FIG. 10, system performance may be improved.

The data processing system 3000 in FIG. 13 may be applied to one of an ultra mobile PC (UMPC), a workstation, a net-book, a personal digital assistant (PDA), a web tablet, a wireless phone, a mobile phone, a smart phone, an e-book, a portable multimedia player (PMP), a portable game device, a navigation device, a black box, a digital camera, a 3-dimensional television, a digital audio recorder, a digital audio player, a digital picture recorder, a digital picture player, a digital video recorder, a digital video player, a device capable of transmitting/receiving data in an wireless environment and various electronic devices constituting a home network, one of various electronic devices constituting a computer network, one of various electronic devices constituting a telematics network, a radio-frequency identification (RFID) device, or one of various constituents constituting a computing system.

Figure 14:
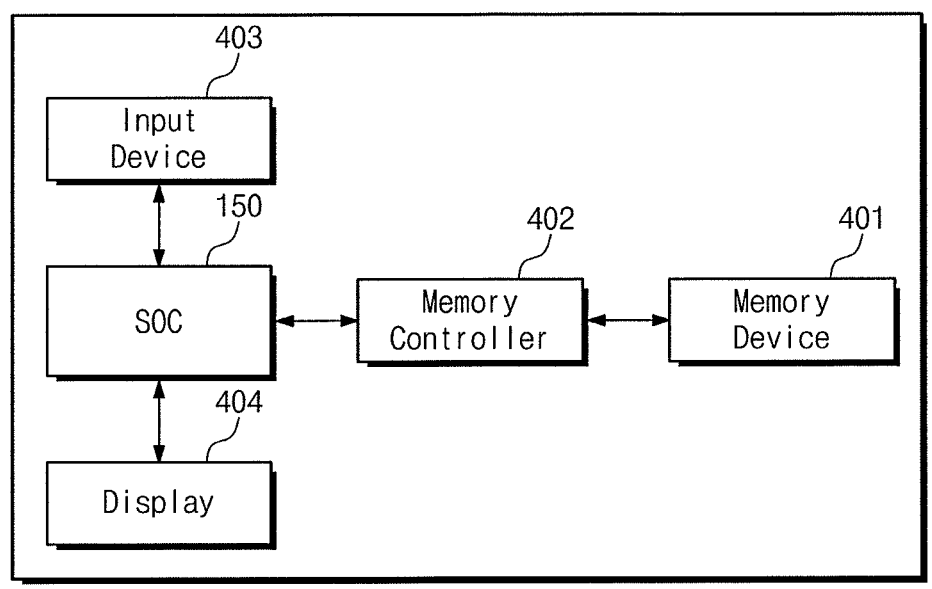
FIG. 14 illustrates a block diagram of an example of a memory module according to embodiments applied to yet another data processing system.

FIG. 14 is a block diagram illustrating an example of embodiments applied to another data processing system 4000. The data processing system 4000 including an SoC 150 shown in FIG. 14 may be implemented using an image processing device such as a digital camera or a mobile phone or smartphone with a digital camera.

The data processing system 4000 includes an SoC 150, a memory device 401, and a memory controller 402 to control a data processing operation (e.g., write or read operation) of the memory device 401. The digital electronic device 4000 may further include an image sensor 403 and a display 404. The memory device 401 may constitute a memory module.

The image sensor 403 of the data processing system 4000 converts an optical image into digital signals and transmits the converted digital signals to the SoC 150 or the memory controller 402. The converted digital signals may be displayed through the display 404 or stored in the memory device 401 through the memory controller 402 according to the control of the SoC 150. Data stored in the memory device 401 is displayed through the display 403 according to the control of the SoC 150 or the memory controller 402.

The data processing system 4000 in FIG. 14 may include the same memory system as shown in FIG. 10, and power integrity and operating speed are improved by a distinct structure of the memory module.

According to the embodiments described above, since a reference plane layer in a module tab area is recessed below a signal tab and is non-recessed below a power tab, power integrity is improved. As a result, since the power integrity is improved while keeping signal integrity, performance of a memory module is made robust.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims. For example, it is possible to adjust a semiconductor memory including a DRAM by changing, adding, or removing the circuit configuration or arrangement in the drawings without departing from the technical spirit of the present disclosure in other cases.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory module, comprising:
   a surface layer on a substrate, a portion of the surface layer including a signal tab and a power tab spaced apart from each other and defining a module tab area in the surface layer;
   a reference plane layer below the surface layer, the reference plane layer being recessed below the signal tab and being non-recessed below the power tab; and
   an insulating layer between the surface layer and the reference plane layer, the insulating layer being parallel to the substrate and separating the module tab area of the surface layer from the reference plane layer.

2. The memory module as claimed in claim 1, wherein the power tab is a tab applied with a power supply voltage.

3. The memory module as claimed in claim 1, wherein the power tab is a tab applied with a ground voltage.

4. The memory module as claimed in claim 1, wherein the surface layer and the reference plane layer include a same conductive metal.

5. The memory module as claimed in claim 4, wherein the conductive metal is a copper or a copper-based alloy.

6. The memory module as claimed in claim 1, wherein the insulating layer completely separates the surface layer from the reference plane layer, the insulating layer being a prepreg layer.

7. The memory module as claimed in claim 1, wherein:
   the surface layer includes a first surface layer disposed at an uppermost portion of the substrate, and a second surface layer disposed at a lowermost portion of the substrate, and
   the reference plane layer includes a first reference plane layer disposed below the first surface layer, and a second reference plane layer above the second surface layer.

8. The memory module as claimed in claim 1, wherein the reference plane layer, the insulating layer, and the surface layer are stacked on the substrate in the stated order, only an edge of the reference plane layer overlapping the module tab area including a recessed portion below the signal tab.

9. The memory module as claimed in claim 1, wherein the memory module is a dual in-line memory module (DIMM).

10. The memory module as claimed in claim 1, wherein:
    a non-recessed portion of the reference plane layer is a layer portion overlapping the power tab, and
    a recessed portion of the reference plane layer is an empty space overlapping the signal tab, the empty space directly contacting a lateral side of the layer portion and having a same thickness as the layer portion along a direction normal to the substrate.

11. The memory module as claimed in claim 1, wherein the reference plane layer is recessed only below the signal tab among the signal tab and the power tab.

12. A method for forming a selectively recessed reference plane, the method comprising:

forming a signal tab and a power tab spaced apart from each other on a surface layer of a substrate, the signal tab and the power tab defining a module tab area;

forming a reference plane layer below the surface layer, such that the reference plane layer is recessed below the signal tab and non-recessed below the power tab; and forming an insulating layer between the surface layer and the reference plane layer, such that the insulating layer is parallel to the substrate and separates the module tab area of the surface layer from the reference plane layer.

13. The method as claimed in claim 12, wherein the signal tabs are contact terminals for data communication between a semiconductor memory chip and an external controller.

14. The method as claimed in claim 12, wherein the power tabs are contact terminals to apply a power supply voltage or a ground voltage to a semiconductor memory chip.

15. The method as claimed in claim 12, wherein forming the signal tabs includes recessing via an etch process.

16. The method as claimed in claim 12, wherein forming the signal tabs and the power tabs includes a same material as that of the reference plane layer.

17. A memory module, comprising:
a surface layer on a substrate, an edge of the surface layer defining at least one signal tab and at least one power tab spaced apart horizontally from each other;
a reference plane layer on the surface layer, the reference plane layer including:
a layer portion overlapping the at least one power tab, and
an empty space overlapping the at least one signal tab, the empty space directly contacting a lateral side of the layer portion and having a same thickness as the layer portion along a direction normal to the substrate; and
an insulating layer between the surface layer and the reference plane layer, the insulating layer covering the layer portion and the empty space.

18. The memory module as claimed in claim 17, wherein the empty space overlaps only the signal tab among the at least one signal tab and the at least one power tab, the empty space completely overlapping the at least one signal tab, and the layer portion completely overlapping the at least one power tab.

19. The memory module as claimed in claim 18, wherein the insulating layer completely and continuously overlapping the at least one power tab, the at least one signal tab, and a space between the power and signal tabs, the reference plane layer being electrically connected to the power tab through a via contact in the insulating layer.

20. The memory module as claimed in claim 17, wherein the substrate is a multi-layered printed circuit board (PCB).

* * * * *